United States Patent [19]

Yamagiwa et al.

[11] Patent Number: 4,812,684
[45] Date of Patent: Mar. 14, 1989

[54] MULTIPHASE CLOCK DISTRIBUTION FOR VLSI CHIP

[75] Inventors: Akira Yamagiwa; Toshihiro Okabe, both of Hadano, Japan

[73] Assignee: Hitachi, Ltd., Tokyo, Japan

[21] Appl. No.: 146,864

[22] Filed: Jan. 22, 1988

[30] Foreign Application Priority Data

Feb. 23, 1987 [JP] Japan .................. 62-37951

[51] Int. Cl.[4] .......................................... H03K 19/096
[52] U.S. Cl. ...................... 307/480; 307/443;
 307/452; 307/481; 307/601; 307/303
[58] Field of Search ............... 307/443, 448, 451–453,
 307/475, 480, 481, 511, 242, 582, 269, 594, 597,
 601, 605, 303

[56] References Cited

U.S. PATENT DOCUMENTS

| 4,587,445 | 5/1986 | Kanuma | 307/480 X |
| 4,656,370 | 4/1987 | Kanuma | 307/296 R X |
| 4,675,555 | 6/1987 | Okajima et al. | 307/475 X |
| 4,682,055 | 7/1987 | Upadhyayula | 307/451 |
| 4,700,088 | 10/1987 | Tubbs | 307/480 |
| 4,727,266 | 2/1988 | Fujii et al. | 307/303 X |
| 4,742,254 | 5/1988 | Tomisawa | 307/451 X |
| 4,761,567 | 8/1988 | Walters, Jr. et al. | 307/475 X |

FOREIGN PATENT DOCUMENTS 55-80136 3/1980 Japan .

OTHER PUBLICATIONS

Mead and Conway, Introduction to VLSI Systems, Addison–Wesley Pub. Co., Reading, Mass., Oct. 1980, pp. 229–233.

Primary Examiner—David Hudspeth
Attorney, Agent, or Firm—Pennie & Edmonds

[57] ABSTRACT

Multi-phase clock signals are delivered to a large number of load circuits scattered on a chip from clock signal input pins through at least three stage buffer circuits. The first stage buffer circuits are arranged in the neighborhood of the input pins, and the second stage buffer circuits are arranged on the central portion of the chip. Equivalent-length wirings are made between the successive two stage buffer circuits and the same number of subsequent stage buffer circuit are connected with each of certain stage buffer circuits for the respective phases so as to provide equal resistances and equal capacitances. Equivalent-length wirings are also made between final stage buffer circuits and the corresponding load circuits, and the same number of load circuits are connected with each final stage buffer circuit. Thus, equal delay times are provided in the clock signal paths from the input pins to the load circuits at the respective phases.

6 Claims, 3 Drawing Sheets

MULTIPHASE CLOCK DISTRIBUTION FOR VLSI CHIP

BACKGROUND OF THE INVENTION

This invention generally relates to a large scale semiconductor logic device and more specifically to a clock signal circuit suitably used in a large scale semiconductor logic device for use in a high speed digital processing device.

A large scale semiconductor logic device having a large number of gates as many as 100000 gates generally includes, over a large area on the chip, many sequential logic circuits such as flip-flops, memories, register files, etc. These sequential logic circuits are operated in synchronism with plural clock signals having different phases which are applied to the circuits. These sequential circuits are hereinafter referred to as load circuits since they serve as loads when viewed from a clock signal source. Many lines for supplying the clock signals to the load circuits, which are arranged on the chip, are increasingly complicated as the logic device is large-scaled.

The logic device thus obtained is not properly operated if the above multi-phase clock signals are not coincident in their phase relation between when they are input to the logic device and when they reach the load circuits. Therefore, it is very important for the large scale semiconductor circuit that the multi-phase clock signals can be delivered to the load circuits with their less possible skew.

JP-A No. 55-80131 that was filed in Japan on Dec. 14, 1978 by Fujitsu Limited discloses means for producing clock pulses at a high speed and adjusting their phase which are carried out through the waveform conversion by a chopper circuit, and also proposes equivalent-length wiring for delivering the clock pulses with equal delay times.

However, it is increasingly difficult to make uniform the delay times in the respective clock signal lines with an increase of the integration degree of the circuits on the chip. It is also difficult to reduce the skew only by means of the equivalent-length wiring. A different number of the load circuits connected with a certain clock signal line will provide a different load capacitance, thus also providing a different delay time.

SUMMARY OF THE INVENTION

An object of this invention is to provide a large scale semiconductor logic circuit that can deliver multi-phase clock signals to many load circuits with their equal delay time.

In this invention, the multi-phase clock signals are delivered to a large number of load circuits scattered on a chip from clock signal input pins through at least three stage buffer circuits. The first stage buffer circuits are arranged in the neighborhood of the input pins, and the second stage buffer circuits are arranged on the central portion of the chip. Equivalent-length wirings are made between the successive two stage buffer circuits and the same number of subsequent stage buffer circuits are connected with each of certain stage buffer circuits for the respective phases so as to provide equal resistances and equal capacitances. Equivalent-length wirings are also made between final stage buffer circuits and the corresponding load circuits, and the same number of load circuits are connected with each final stage buffer circuit. Thus, equal delay times are provided in the clock signal paths from the input pins to the load circuits at the respective phases.

DESCRIPTION OF THE PREFERRED EMBODIMENTS

Prior to explaining the embodiments of this invention, the principal technical idea of this invention will be explained.

Clock signals can be delivered from a first stage buffer circuit to a second stage buffer circuit by the wirings the number of which corresponds to that of the phases of the clock signals, and the wirings can be easily made previously so as to provide equal delay times since the second buffer circuit is located at the central portion of the chip. The location of a final stage buffer circuit and load circuits is decided in designing the chip after the location of the logic signal circuits other than the clock signal circuits is decided. Therefore, the final stage buffer circuit and the load circuits are irregularly arranged on the respective portions of the chip. Under such a condition, the equal delay time wiring between the final stage buffer circuit and the previous stage buffer circuit 1 the load circuits which are located before and after the final stage buffer circuit is carried out using the feature that any buffer circuit/load circuit has versatility in the same phase clock signal. Further, in order that the input capacitances in the subsequent stage are equal for all clock phases, the number of the circuits at the subsequent stage is made equal for all the clock phases using dummy circuits.

Figure 1:
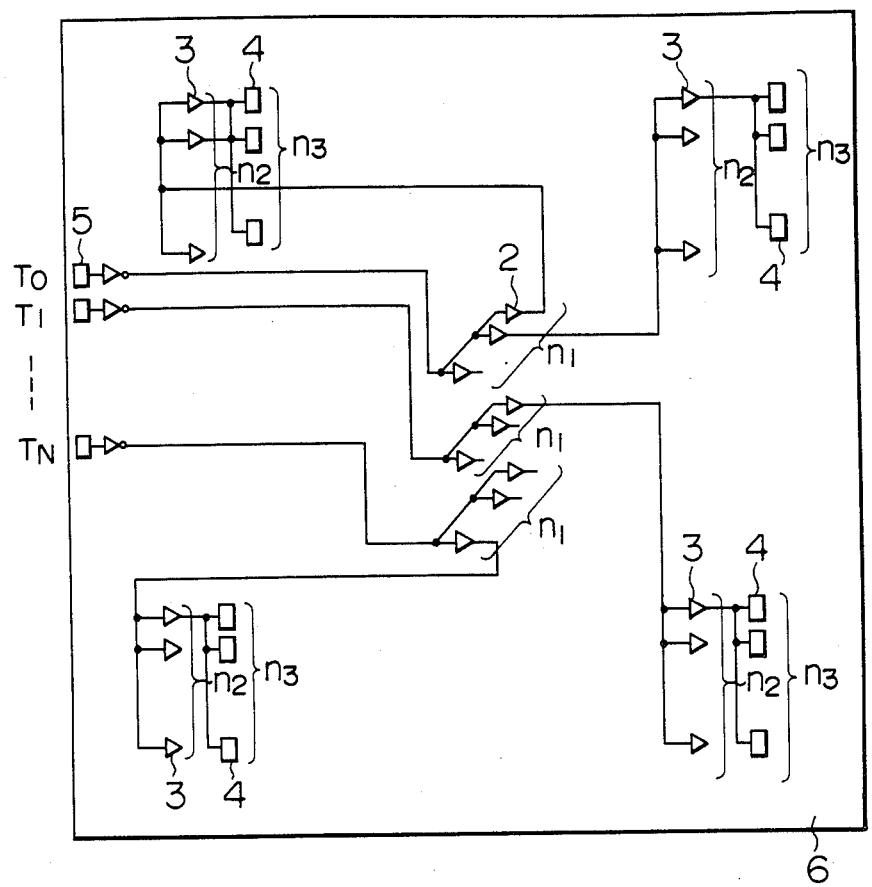
FIG. 1 is a view showing the schematic arrangement according to one embodiment of this invention.

Embodiments of this invention will be explained with reference to the drawings. As seen from FIG. 1, a chip 6 has a large scale semiconductor logic circuit formed thereon. Signal input/output pads are arranged in the periphery of the chip 6. The output pads are not shown. Particularly, the input pads (pins) 5 of multi-phase clock signals are collectively arranged at the central portion in the periphery so as not to provide any variation in the phase relation among the input clock signals. Such an arrangement of the pins 5 can minimize the lengths of the wirings between the pads and first stage buffer circuits and also can make equal the lengths at respective phases of the clock signals. The clock signals having different phases $T_0, T_1, \ldots T_n$ are applied to the corresponding pins 5. In the case of FIG. 1, the multi-phase $(N+1)$ clock signals are applied to the pads 5. The first stage buffer circuits 1, the number of which corresponds to that of the phases of the clock signals are arranged in the neighborhood of the pads 5. All the buffer circuits used are identical devices.

Second stage buffer circuits 2 are arranged at the substantially central portion of the chip 6. Equivalent-length equivalent-capacitance wirings are made between the first stage 1 and the second stage 2 not so as to provide any variation in the phase relation among the clock signals having the corresponding phases. Each of the first stage buffer circuits 1 which corresponds to each phase of the clock signal is connected with $n_1$ identical second stage buffer circuits 2. Namely, it should be noted that the same number of second stage buffer circuits are provided for any phase of the clock signal so as to provide the same capacitance for each phase. Dummy buffer circuits are used if necessary.

Figure 2:
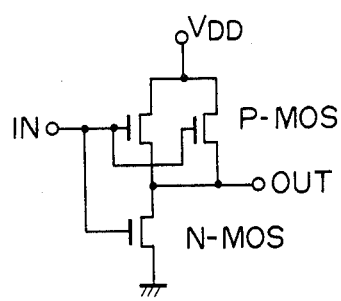
FIG. 2 is a circuit diagram showing one example of a buffer circuit.

FIG. 2 shows an example of the buffer circuit constructed by a CMOS inventer circuit. Generally, a P-MOS transistor and an N-MOS transistor are different in their time constant since the former has a larger on-resistance than the latter. Therefore, in the case where the buffer circuit is constructed by a CMOS transistor, the rising and trailing time constants of both transistors are desired to be made substantially equal by forming the P-MOS transistor in a larger scale than the N-MOS transistor whereby the on-resistance of the P-MOS transistor is decreased. In the example of FIG. 2, two P-MOS transistors are provided at the upper side to make the entire on-resistance thereof equal to that of the N-MOS transistor. The buffer circuit as shown in FIG. 2 can be applied for the buffer circuit at any buffer stage. By arranging the second stage buffer circuits 2 at the central portion of the chip 6, the wirings to the subsequent stage buffer circuits may be easily made in their equivalent-length.

Each output of the second stage buffer circuits 2 is connected with $n_2$ identical third stage buffer circuits 3. Namely, the same number of third stage buffer circuits are provided at any phase so as to provide the same capacitance of the third stage buffer circuit viewed from the outputs of the second stage buffer circuit 2. Each output of the third stage buffer circuits 3 is connected with $n_3$ identical load circuits 4. Namely, the same number of load circuits 4 are provided at any phase. If this can not be made in designing the logic circuit, dummy load circuits are added.

Figure 3A:
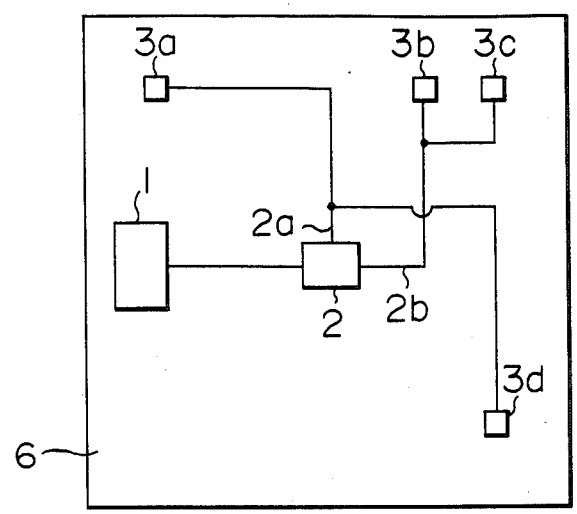
FIGS. 3A and 3B show views for explaining alternative connections in the buffer circuit.
Figure 3B:
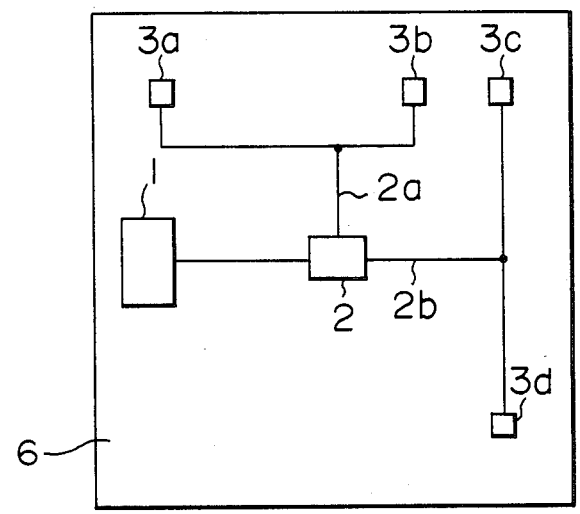

Clock signal delivery from the second stage buffers 2 to the third stage buffers 3 and from the third stage buffer circuits 3 to the load circuits 4 is carried out as follows. First, the locations of all the circuits in the chip 6 are decided on the basis of all items of logic connection information in the chip. By inputting the logic connection information to a computer using a known computer aided design technique, the arrangement of logic gates and clock signal circuits and the wirings thereamong are automatically decided. In this case, the clock signal circuits, the arrangements in the third stage buffer circuits and the load circuits are not carried out preferentially to the other wirings of logic signals in consideration of the equivalent-length wirings or the equivalent-capacitance wirings in the clock signal circuits. Thus, the third stage buffer circuits 3 and the load circuits 4 are irregularly arranged on the entire surface of the chip. Therefore, if, using the first logic connection information under such an arrangement, the second stage buffer circuits are connected with the third stage buffer circuits and the third stage buffer circuits are connected with the load circuits, their equivalent-length wirings can not be realized. Now it should be noted that all the buffer circuits belonging to the third stage are identical and the clock signals in the same phase are identical so that replacements can be made among the third buffer circuits 3 and among the load circuits. Therefore, the original connection relation in the clock signal circuits can be changed into the connection relation allowing equivalent-length wirings. FIG. 3A shows the arrangement of the clock signal circuits and their wiring which is decided on the basis of the original logic connection information. FIG. 3B shows the equivalent-length wirings obtained by changing the connection relation between the second stage buffer circuits 2 and the third stage buffer circuit 3. More specifically, in FIG. 3A, the wiring from the second stage buffer circuit 2 to the four third stage buffer circuits 3a to 3d is made in such a way that the buffer circuits 3a, 3d are connected with a line 2a and the buffer circuits 3b, 3c are connected with a line 2b. In the equivalent-length wiring shown FIG. 3B, the buffer circuits 3a, 3b are connected with the line 2a and the buffer circuits 3c, 3d are connected with the line 2b. Although FIG. 3A and FIG. 3B are different in their connection relation of wirings, the same clock signal is supplied to the respective third stage buffer circuits. Such a change of the connection relation of wirings can be made also between the third stage buffer circuits 3 and the load circuits 4.

Figure 4:
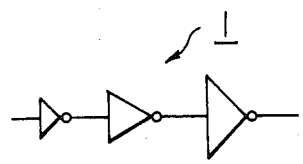
FIG. 4 is a logic circuit diagram showing one example of the first stage buffer circuit shown in FIG. 1.
Figure 5:
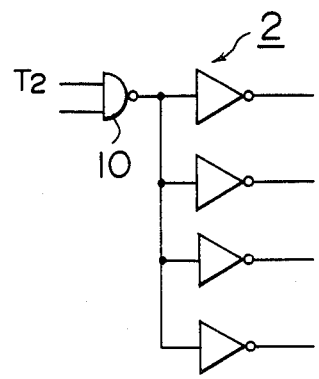
FIG. 5 is a logic circuit diagram showing one example of the second stage buffer circuit shown in FIG. 1.
Figure 6:
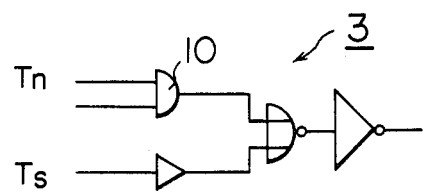
FIG. 6 is a logic circuit diagram showing one example of the third stage buffer circuit shown in FIG. 1.

FIGS. 4, 5 and 6 show actually used logic circuits of the buffer circuits belonging to the first, second and third stages, respectively. The first stage buffer shown in FIG. 4 is formed in a three-stage inventer for the purpose of converting a chip input level into a chip internal level and of gradually increasing a driving capacity of the buffer. The second stage buffer circuit shown in FIG. 5 and the third stage buffer circuit shown in FIG. 6 are formed in a structure having an AND gate 10 for stopping clock signals. Particularly, the third stage buffer circuit shown in FIG. 6 is also adapted to provide another Ts phase clock signal for performing a scanning operation when the Tn phase clock signal is stopped.

Figure 7:
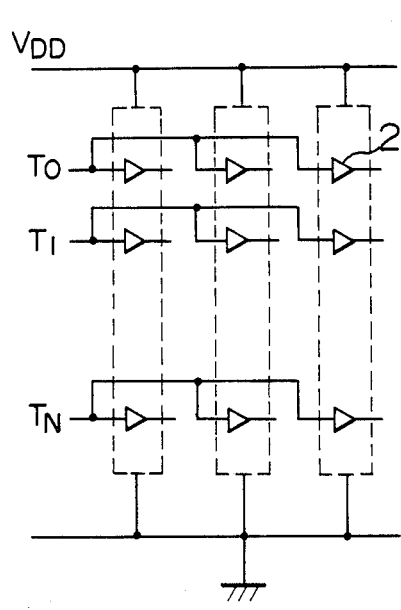
FIG. 7 is a view showing a unified arrangement of the second buffer circuits in FIG. 1.

FIG. 7 shows a collective arrangement of the clock buffer circuits collected at the central portion of the chip. As shown in FIG. 7, the clock buffer circuits belonging to different clock phases are collected in groups in order to prevent noise in a power supply and earth line, which will occur when many buffer circuits are simultaneously operated, and wiring migration from being produced. In other words, the buffer circuits belonging to the same phase employ different power source lines $V_{DD}$ and earth lines.

Figure 8:
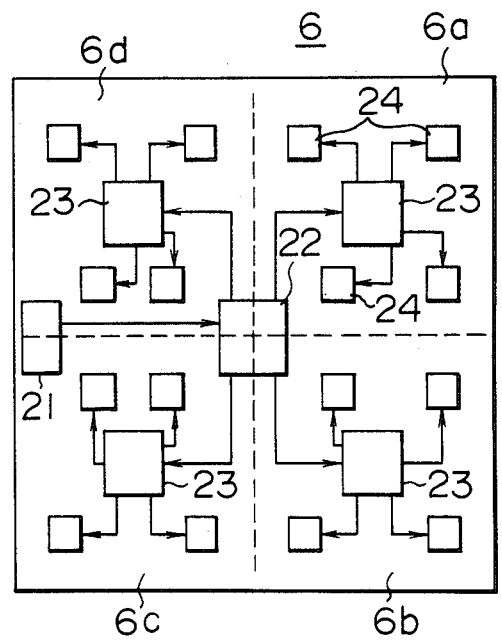
FIG. 8 is a view showing the schematic arrangement according to another embodiment of this invention.

Although in the embodiment mentioned, the clock buffer circuits are constructed in three stages, they can be constructed in four or more stages in accordance with the scale of a large scale semiconductor logic circuit. FIG. 8 shows another embodiment of this invention in which the clock buffer circuits are arranged in four stages. As in the embodiment of FIG. 1, first stage buffer circuits 21 are arranged in the periphery of the chip 6, and second stage buffer circuit 22 are arranged at the central portion of the chip. Third stage buffer stages 23 are arranged at the substantially central portion of each of the areas 6a to 6d obtained by dividing the chip 6 into four parts. Fourth stage buffer circuits 24, which are final stage clock buffer circuits, and load circuits (not shown) are arranged in the same manner as the third stage buffer circuits and the load circuits in the embodiment shown in FIG. 1. It is needless to say that equivalent-length wiring and equivalent-capacitance wiring are made between the buffer circuits and between the buffer circuits and the load circuits. The clock buffer circuits can also be arranged in five or more stages in the same manner as FIG. 7.

In accordance with this invention, wirings by input buffer circuits towards the central portion of a chip where subsequent buffer circuits are arranged are made for load circuits extended over the whole portion of the chip, and for further subsequent buffer circuits and the load circuits which are extended over the whole portion of the chip from the above subsequent buffer circuits equivalent-capacitance wirings are made after clock signal connection information is reconstructed in the same clock phase so that the lengths of the wiring paths are substantially equal. Thus, change in the phase relation among clock signals can be made very small. Then, if the equivalent-capacitance wiring alone can not remove some change between the rising and trailing responses some change in the clock pulse width will occur. This change can be prevented by setting the transistors used in the buffer circuits in their optimum size. Further, the noise due to the simultaneous operation of many buffer circuits in the same phases and the wiring migration can be obviated by collecting, the clock buffer circuits belonging to different clock phases in respective groups.

We claim:

1. A large scale semiconductor logic device operated by a plurality of clock signals having different phases which is arranged on a chip, comprising:
   (A) a plurality of input terminals for receiving said plurality of clock signals;
   (B) a plurality of buffer circuits constructed in at least three stages in series connection, which are connected with each of said plurality of input terminals, in which first stage buffer circuits are arranged in the neighborhood of said input terminals and connected therewith and second stage buffer circuits are arranged at the central portion of the chip and connected with said first stage buffer circuits; and
   (C) a plurality of load circuits receiving said plurality of clock signals through said plurality of buffer circuits, said plurality of load circuits being connected with final stage buffer circuits of said plurality of buffer circuits; between said second stage buffer circuits and said final stage buffer circuits, wirings are made between the buffer circuits belonging to successive stages so that the path lengths therebetween are substantially equal and each of certain stage buffer circuits is connected with the same number of subsequent stage buffer circuits; and wirings are made between the final stage buffer circuits and the load circuits so that the path lengths therebetween are substantially equal and each of the final stage buffer circuits is connected with the same number of load circuits.

2. A large scale semiconductor logic device according to claim 1, wherein said plurality of buffer circuits are constructed in four stages in series connection, said final stage buffer circuits are fourth stage buffer circuits, and third stage buffer circuits are arranged at the central portion of each of four areas obtained by dividing the chip into four parts centering the second stage buffer circuits.

3. A large scale semiconductor logic device according to claim 1, wherein at least each of said plurality of final stage buffer circuits among said plurality of buffer circuits is a C-MOS logic device, said C-MOS logic device comprises an N-MOS transistor part and a P-MOS transistor part having a larger size than the N-MOS transistor part so as to make substantially equal the rising and trailing responses of the C-MOS logic device.

4. A large scale semiconductor logic device according to claim 1, wherein the buffer circuits receiving different phase clock signals are adjacently arranged in respective groups and the buffer circuits belonging to the different groups are supplied with power through different power lines.

5. A large scale semiconductor logic device according to claim 2, wherein the buffer circuits receiving different phase clock signals are adjacently arranged in respective groups and the buffer circuits belonging to the different groups are supplied with power through different power lines.

6. A large scale semiconductor logic device according to claim 3, wherein the buffer circuits receiving different phase clock signals are adjacently arranged in respective groups and the buffer circuits belonging to the different groups are supplied with power through different power lines.

* * * * *